United States Patent [19]
Nijman

[11] 4,079,343
[45] Mar. 14, 1978

[54] CONNECTOR FILTER ASSEMBLY

[75] Inventor: John P. Nijman, West Hill, Canada

[73] Assignee: Bunker Ramo Corporation, Oak Brook, Ill.

[21] Appl. No.: 734,576

[22] Filed: Oct. 21, 1976

Related U.S. Application Data

[63] Continuation of Ser. No. 539,289, Jan. 8, 1975, abandoned.

[51] Int. Cl.$^2$ ............ H03H 7/04; H03H 13/00; H01R 13/66; H01R 23/08
[52] U.S. Cl. ............ 333/79; 333/70 S; 339/143 R; 339/147 R; 339/278 A
[58] Field of Search ............ 333/79, 73 C, 70 R, 333/70 S; 339/147 R, 147 P, 278 R, 278 C, 278 A, 136 R, 143 R, 114; 361/301–305

[56] References Cited

U.S. PATENT DOCUMENTS

| | | | |
|---|---|---|---|
| 3,181,044 | 4/1965 | Duncan | 361/302 |
| 3,200,355 | 8/1965 | Dahlen | 333/79 |
| 3,447,104 | 5/1969 | Schor | 333/79 |
| 3,854,107 | 12/1974 | Tuchto et al. | 333/79 |

OTHER PUBLICATIONS

Freudiger–"Electrical Contact Materials" Reprint from Electro-Technology, June 1962 Technical Publication Corporation; Title page and 7 pages text.

*Primary Examiner*—Archie R. Borchelt
*Assistant Examiner*—Marvin Nussbaum
*Attorney, Agent, or Firm*—William Lohff; F. M. Arbuckle

[57] ABSTRACT

The following specification describes a connector assembly employing a capacitor assembly having axially spaced radially extending capacitor plates carried by a ceramic or dielectric member. One plurality of plates are connected in common to the connector shell and other radially extending axially spaced plates are connected to respective contacts of the connector to form a filter capacitor for each contact. A conductive elastomer or metal spring engaging one of the common plates under axial pressure ensures a secure electrical ground connection between the plates common to the connector contacts and the shell while a metal spring preassembled to each contact at an axial position coincident with the capacitor assembly exerts a radial outward pressure to ensure an electrical connection to the capacitor plates associated with the respective contact.

13 Claims, 3 Drawing Figures

CONNECTOR FILTER ASSEMBLY

This is a continuation application of application Ser. No. 539,289, filed Jan. 8, 1975, now abandoned.

BACKGROUND OF THE INVENTION

1. Field of the Invention

This invention relates in general to connector filter assemblies and more particularly, to an improved and more economical high frequency filter assembly for a pin connector assembly.

2. Summary of the Prior Art

Filters for connectors utilize the connector shell for a ground return and include respective capacitors connected between the connector contacts and the connector shell. The contacts are usually elongate pin contacts engaging receptacle contacts of a mating shell and the capacitors comprise elongate annular or tubular capacitor plates coaxially encircling a respective pin contact with one plate of the capacitor connected to the pin contact and the other plate connected to the shell. For high frequency filtering, only a capacitor may be required, but for lower frequency filtering, an inductance may also be provided encircling a respective pin contact.

In any event, to provide sufficient filtering with the relatively small areas available in the coaxial arrangement of the pin contacts and capacitor plates, considerable elongation of the pin contact is required as compared with the standard length of a pin contact and precision fabrication together with individual handling may be required.

A capacitor assembly including radially extending capacitor plates carried by a dielectric member common to all of the pin contacts assists in solving the space problem. The dielectric member is integrally formed of ceramic layers with axially spaced radially extending metal capacitor plates between each layer connected alternately to the shell and to a respective contact.

Thus a series of radially extending plates in alternate axial positions are connected in common at the periphery of the dielectric member to provide the ground connection to the shell and other plates are connected to a respective contact extending through a respective hole in the dielectric as, for example, shown in U.S. Pat. No. 3,538,464. In that patent, the connection to the contacts required substantial axial space so that some of the space saving advantages of the radially extending capacitor plate assembly was lost and in addition, uneconomic assemblies were required for the contacts, while no means were provided to hold the connections at the periphery of the capacitor assembly to the shell.

SUMMARY OF THE INVENTION

In the present invention, one ground connected common plate located at the front axial face of the dielectric member is engaged with a conductive elastomer or metal spring. The elastomer or spring in turn is held under axial pressure between the one plate and the conventional internal shoulder on the shell with the pressure provided by the simple assembly of the conventional retention disc in the shell to economically provide a secure electrical connection in a minimum of axial space to the shell.

To provide a connection between each contact and its respective plates a common electrode at the hole through which the contact extends, is engaged with a metal spring clip which is axially coincident with the capacitor assembly so that no additional axial space is required. The spring clip is an economically fabricated element preassembled to each contact and securely held thereon by a recess in the contact surface. The contact carrying the clip is simply inserted in its hole and the spring clip exerts a radial outward pressure against the electrode in the hole to ensure the connection between the contact and its plates.

A silicone rubber cushion may also be provided in the connector filter assembly at the rear axial face of the dielectric member opposite the conductive elastomer. The silicone rubber cushion serves not only to absorb shock and vibration transmitted to the ceramic member but serves to absorb the axial pressures exerted on the member when the pin contacts are engaged with the contacts of a mating connector shell, since considerable axial pressure is then applied to the connector assembly.

Likewise, a ferrite disc may be assembled in axially adjacent relationship to the capacitor assembly, if desired.

Thus the provision of a single capacitor assembly which is conventionally prefabricated, considerably reduces the required handling, since only one assembly need be inserted in the connector to provide the required filters while secure connections to the shell and to the contacts are provided without precision fitting and in the minimum of axial space.

BRIEF DESCRIPTION OF THE INVENTION

Figure 1:
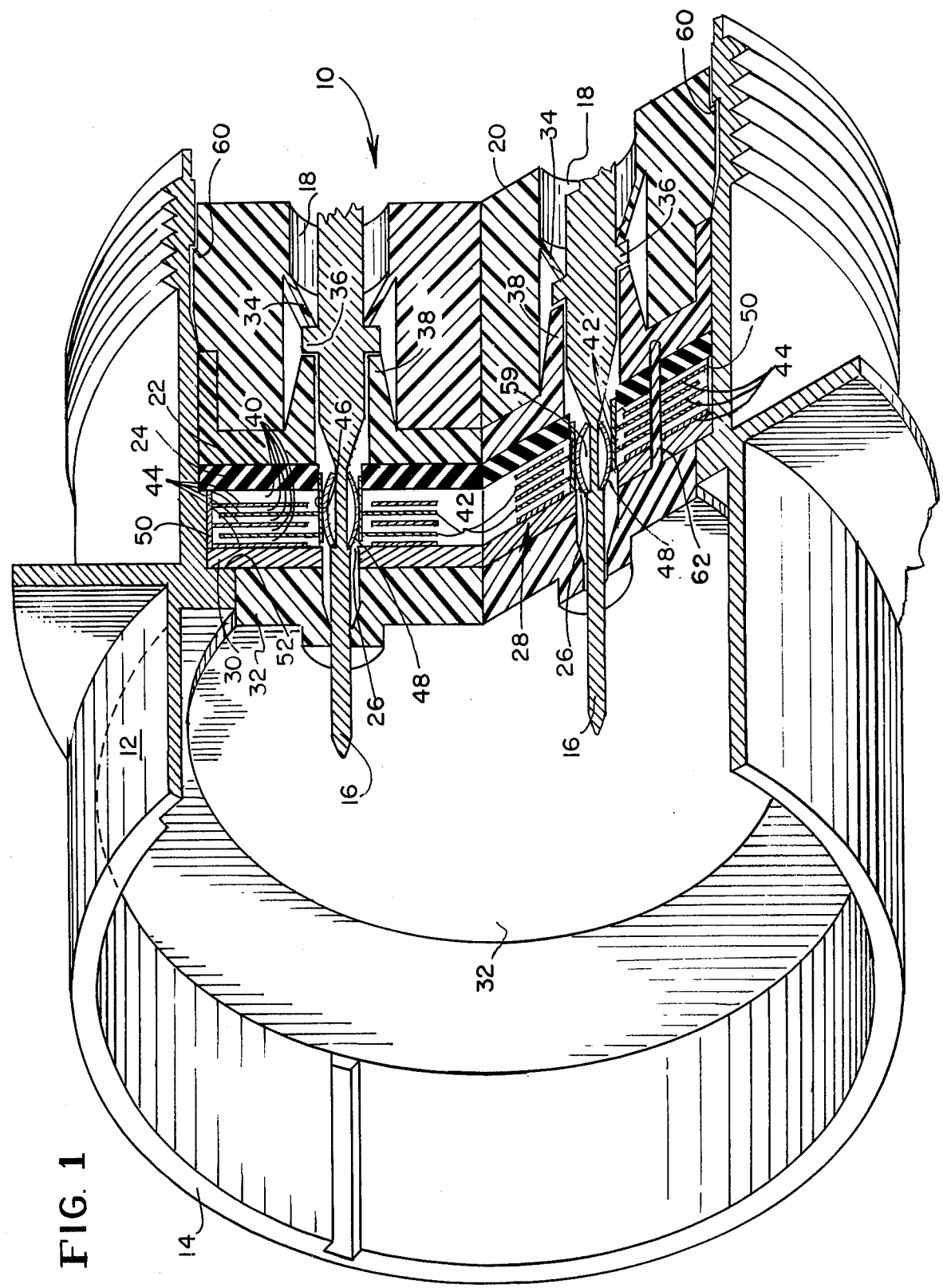
FIG. 1 is an exploded isometric sectional view of a connector including the improved filter assembly.

In FIG. 1, a pin contact connector assembly is indicated by the reference character 10. The connector assembly 10 comprises a generally annular metal shell 12 having a front end 14 for telescoping engagement with the shell of a mating connector (not shown) to electrically connect pin contacts such as 16 in shell 12 with the receptacle contacts of the mating connector under a desired axial pressure.

The pin contacts 16 are each received in a respective contact receiving passageway 18 of a rear dielectric retention insert 20 secured in shell 12 and pass through a respective aligned passageway in a dielectric disc 22, a silicone rubber cushion or disc 24 and then through a respective aligned passageway 26 in a capacitor assembly 28, an aligned passageway in a conductive elastomer or disc 30 and project through an aligned passageway in a front dielectric insert 32 secured in the shell 12 to enable the engagement of the pin contacts with the receptacle contacts of a mating connector.

Conventional retention tines 34 are formed on the dielectric retention insert 20 and extend into each passageway 18 for engagement behind the rear radial face of an enlarged diameter portion or shoulder 36 on the contacts to prevent their retraction unless the fingers 34 are spread by a suitable tool. The front radial face of the shoulder 36 engages the rear face or projection 38 on member 22 to limit forward movement of the contacts. A conductor (not shown) is secured to the rear end of each contact to provide an electrical connection therewith and a conventional grommet (not shown) secured on the shell 12, protects the connection.

The capacitor assembly 28 comprises a plurality of ceramic layers 40 of suitably high dielectric constant bonded together to form an integral structure or assembly and between which are located radially extending metal capacitor plates 42 and 44 in alternate axially spaced positions. Plates 42 and 44 form the opposing plates of a capacitor for each pin contact. The plates 42 are connected to a respective pin contact 16 through a common electrode 46 formed at the surface of the respective perforation or passageway 26 and a metal spring 48 formed in a split ring, for example.

The outer periphery of assembly 28 is provided with an electrode 50 engaging the inner wall surface of shell 12 and connected in common to the radial plates 44 with one of the plates 44 being formed on the front or one radial face of the assembly 28 for engagement with the rear radial face of elastomer 30. The elastomer 30, in turn, engages a radially inwardly extending shoulder 52 on the inner periphery of shell 12 to ensure the proper electrical connection of the shell to plates 44.

Figure 2:
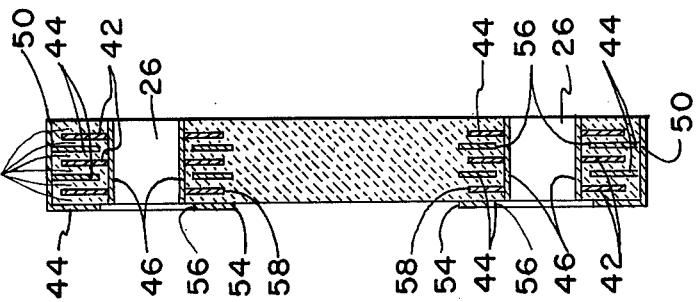
FIG. 2 is a sectional view of a typical capacitor assembly such as shown in FIG. 1.

The plates 44 and electrode 50 are preferably annular, or rings, as seen in FIG. 2 with an inner boundary 54 for the plates 44 at a selected inner radial position. Alternatively, the plates 44 may each be a disc or other shape, but in any event, if the plates 44 extend radially inward to a position past a passageway 26, the plates 44 are perforated as shown at 56 adjacent the passageway so that they do not engage the pin contacts or electrode 46. The plates 44 are thus common to all of the plates 42, which in turn individually correspond to respective ones of the pin contacts 16. The plates 42 and electrodes 46 may also be annular or rings with their inner boundaries at passageways 26 and their outer boundaries encircling the respective passageway 26 as seen at 58; however, the radial extent or peripheral configuration of plates 42 are selected to space the same from the plates 42 connected to other pin contacts while providing the desired coupling area with the plates 44. The chosen configuration, of course, depends on the number and spacing of the pin contacts, however, it will be immediately apparent that a large coupling area is provided between plates 42 and 44. Thus, the multilayer capacitor assembly provided by plates 42 and 44 and high dielectric constant of the ceramic allows a multitude of capacitance variations as high as 1.0 $\mu$F. Also, if desired, an inductance or ferrite layer printed or sandwiched with the ceramic may be used to obtain Pi filter characteristics.

The spring electrode 48 is generally in the form of a split ring, for example, which is slipped axially over the pin contact 16, until the opposite ends thereof are aligned with a recess 59 in the contact 16 whereafter the opposite axial ends of the ring are seated in the recess and the spring pressure against electrode 46 insures a secure electrical connection between the contact 16 and the inner radial plates 42 of the respective capacitor.

The connector 10 is conventionally assembled by inserting the front dielectric member 32 to which the conductive elastomer 30 may be bonded adjacent the front or one axial end of the shell 12. The front radial face of the elastomer 30 thus engages against the rear radial face of shoulder 52 in the shell 12. The capacitor assembly or member 28 is then inserted in the shell so that the radial capacitor plate 44 on front face of assembly 28 engages the rear face of the elastomer 30. The silicone cushion 24 is then inserted in the shell 12 followed by the intermediate dielectric insert or disc 22 and the retention member 20. The retention member 20 is conventionally retained in the shell as for example, the outer radial shoulder 60 on the retention member 20 fitted in front of the radial shoulder on the inner periphery of the shell to hold the members 22, 24, 28 and 30 under axial pressure against the front shoulder 52 and ensure low resistance connection through the conductive elastomer, which acts similarly to a spring. The contacts 16 carrying a respective spring or electrode 48 are then inserted in their respective passageways with each spring 48 being compressed against the respective inner electrode 46 of the member 28 coincident with the location of the shoulder 36 on each contact between the tines 34 and projection 38. One or more locating pins such as 62 on the front dielectric member may, of course, extend rearwardly through the O ring formed by the conductive elastomer 30 and through the other dielectric members for the purpose of orienting or polarizing each to ensure the proper angular alignment of the parts.

With the described arrangement, an increase of length of only $\frac{1}{8}$ inch over a conventional pin contact arrangement is provided so that pin contacts or the other components of assembly 10 may be replaced by conventional components or vice versa.

When the connector assembly 10 is assembled to a mating connector assembly to electrically connect the pin contacts 16 with respective receptacle contacts, the front dielectric member or face seal 32 is conventionally placed under axial pressure by the conventional rotatable coupling ring used in coupling the two assemblies. The silicone cushion 24 absorbs this pressure and ambient vibrations to avoid fracturing of the ceramic in assembly 28.

Figure 3:
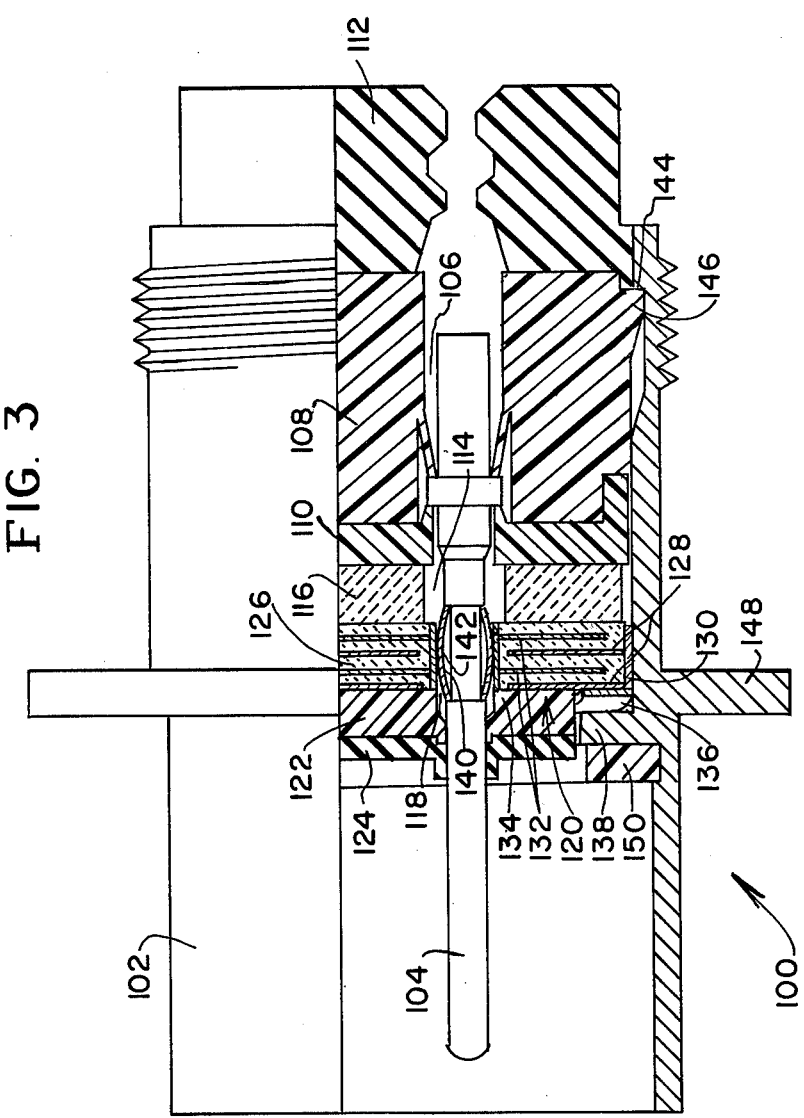
FIG. 3 is a partial sectional view of a conventional power connector utilizing the principles of the present invention.

In FIG. 3, a conventional power connector assembly utilizing conventional components of standard length is indicated by the reference character 100. The connector assembly 100 includes an annular metal shell 102 carrying a plurality of pin contacts such as 104 and arranged for telescoping engagement with a mating connector assembly.

The pin contacts 104 are each located or extend through a respective passageway 106 in a conventional retention disc 108 located adjacent the rear of the shell 102 and through a respective aligned passageway in a conventional front insert 110. The insert 106 and 110 have stop means engaging a shoulder on the contact to limit axial movement of the contact in each axial direction. A conventional rear grommet 112 through which an electrical connection is extended to the terminal or rear end of the contact 104, is located at the rear of the shell behind the retention disc 108.

Each pin contact 104 extends in a forward direction through a respective passageway 114 in a ferrite disc 116 and through a respective passageway 118 in a capacitor assembly 120 and then through another conventional insert 122 and a face seal 124.

The capacitor assembly 120 includes a multi-layer ceramic member 126 which as previously described for assembly 28 has a plurality of axially spaced capacitor plates 128 extending radially inwardly from a common electrode 130 at the periphery of the member 126 and a plurality of axially spaced capacitor plates 132 alternating with plates 128 and extending radially outwardly from a common electrode 134 located at the periphery of a respective hole or passageway 118 individual to a respective contact 104.

The common electrode 130 at the periphery of member 126 connects to radially inwardly extending capacitor face plate or electrode 128 at the front axial face of the member 126. The face plate 128 at the front face of member 126 engages a metal wave washer or spring 136 which in turn engages a conventional radially inwardly extending shoulder 138 on the shell 102. The opposite or rear face of member 126 engages with the ferrite plate or disc 116. It will be noted that each passageway 114 in the disc 116 is somewhat larger than the passageway 118 in member 126, however, connection of the ferrite to the capacitor plates is not deleterious.

The electrode 134 is engaged by an annularly shaped split metal spring clip 140, whose ends are adapted to engage spaced shoulders of a recess 142 formed in the periphery or wall of contact 104 at a position axially aligned with member 126. Thus, the annularly shaped axially slotted clip 140 plated with silver/rhodium, for example, is pre-assembled on contact 104 by sliding the clip over the straight shank forward end of the contact 104 until the clip seats in the recess 142, as may be seen by reference to the drawings. Each contact 104 may then be simply inserted in the respective passageway and when the clip 140 moves into the passageway 118 it is constricted so that its resilience exerts radially outwardly extending pressure against electrode 134 to ensure an electrical connection between the contact and plates 132 at an axial position coincident with the capacitor assembly.

The capacitor assembly 120, or its counterpart assembly 28, is approximately 1/16 inch thick in an axial direction and in this thickness will provide capacitative value up to 1MF. The wave washer or O ring conductive elastomer is also only approximately 1/16 inch thick in an axial direction as is the ferrite disc 116. The retention disc 108 and insert 110 are of conventional size so that the capacitor assembly and elastomer or wave washer when fitted between the insert 110 and shoulder 138 require the addition of no more than a ¼ inch between the shoulder 138 and the shoulder 144 in the internal surface of the shell than that in a standard connector shell. It will be understood, of course, that when the rear shoulder 146 on the retention disc 108 is fitted behind the internal shoulder 144 on the shell in response to axial pressure on the disc that the wave washer or elastomer is held under substantial axial pressure between the shoulder 138 and the front face electrode or plate 128 on capacitor assembly 120.

The shell 102 usually carries a conventional spring biased rotatable coupling ring assembly (not shown) whose axial movement is limited by the radially outwardly extending shoulder 148 on shell 102. When the front end of the shell 102 is telescopingly engaged with a mating shell, and the coupling ring assembly engages with the bayonet pins or other conventional device such as threads on the mating shell, axial pressure is exerted between the shells to move the shells toward each other for engaging the contacts 104 with respective contacts carried by the mating shell. An annular seal 150 adjacent the front face of shoulder 138 is placed under compression thereby as is the face seal 124, however, the washer 136 is held under axial pressure between the retention disc 108 and the shoulder 138, since the shoulders 144 and 146 on the shell and disc resist displacement of the insert.

As is well known to those in the art, a metal wave washer is an annular disk which has a wavy configuration, generally corrugated in shape. When forces are applied to the wave washer in an axial configuration, the wavy configuration gives the washer a spring-like characteristic.

The foregoing constitutes a description of an improved connector filter assembly whose inventive concepts are believed set forth in the accompanying claims.

What is claimed is:

1. An electrical connector assembly including a metal connector shell carrying a plurality of spaced axially extending contacts with each contact spaced radially from each other contact in said shell, the improvement comprising:

a dielectric member in such shell having a respective passageway for each contact and located in a predetermined axial position relative to said shell;
a first metal capacitor plate on said dielectric member common to said plurality of contacts;
means enabling the connection of said first capacitor plate to said metal shell;
another metal capacitor plate for each contact with each other plate individually corresponding to a respective one of said contacts and carried by said dielectric member to form a filter capacitor for each contact; and
means connecting each other individually corresponding plate to a respective contact at an axial position coincident with said dielectric member in said predetermined axial position, wherein said means enabling the connection of said first plate to said shell comprises an electrically conductive member in said shell having a first radial face connected to said common first plate and a second radial face engaging said shell for connecting said common plate to said shell.

2. The assembly claimed in claim 1 in which said conductive member comprises a conductive elastomer.

3. The assembly claimed in claim 1 in which said conductive member comprises a wave washer.

4. In the assembly claimed in claim 1, in which said conductive member is a spring and said shell was a radially inwardly extending shoulder, retention disc means having a passageway for each contact for retaining the foregoing elements in said shell, and means in said shell for placing each radial face of said spring member under axial pressure in response to the receipt of said retention disc means in said shell.

5. The assembly claimed in claim 1 in which a plurality of commonly connected axially spaced first capacitor plates common to all of said contacts are provided on said dielectric member with each first plate extending radially towards each contact, and said first raidal face of said conductive member is under axial pressure against said common first capacitor plate and said second radial face is under axial pressure against said shell.

6. The assembly claimed in claim 5 in which an electrode connected in common to all of said plurality of first plates is carried on the periphery of said dielectric member.

7. The assembly claimed in claim 6 in which each metal spring comprises a split annular member for overlapping engagement with a respective contact, and each contact includes means for locating a respective spring overlappingly engaged therewith at a predetermined axial position.

8. A connector assembly including a metal connector shell carrying a plurality of spaced axially extending contacts with each contact spaced radially from each other contact in said shell, the improvement comprising:
- a dielectric member in said shell having a respective passageway for each contact and located at a predetermined axial position relative said shell;
- a first plurality of common metal capacitor plates carried by said dielectric member and extending radially of said shell towards each contact to form capacitor plates common to all of contacts;
- means connecting each of said first capacitor plates in common to said metal shell under pressure extending axially of said shell, said means including a radially inwardly extending shoulder in said shell, a conductive spring member in said shell having one radial face engaging one plate of said first plurality of plates and another radial face on said spring member engaging said shoulder;
- a second plurality of metal capacitor plates each individually corresponding to a respective contact with each plate of said second plurality of plates carried by said dielectric member and extending radially from a respective passageway and spaced axially adjacent one of said first plurality of plates to form a filter capacitor for each contact; and
- means carried by each contact for exerting pressure in a radially outwardly direction from each contact for connecting each contact in a respective passageway to a respective plate of second pluraity of capacitor plates.

9. The assembly claimed in claim 8 in which said means for connecting said first capacitor plates under axial pressure includes a retention disc received in said shell and having a passageway for each contact aligned with a passageway in said dielectric member, and means on said disc and shell effective in response to the receipt of said disc in a predetermined position in said shell for applying axial pressure between each radial face of said spring member and said one plate and shoulder.

10. The assembly claimed in claim 9 in which said spring member is an O ring of conductive elastomer.

11. The assembly claimed in claim 9 in which said spring member is a wave washer.

12. In the assembly claimed in claim 9, a ferrite disc located intermediate said retention disc and said dielectric member.

13. In the assembly claimed in claim 9, a resilient non-conductive cushion located intermediate said retention disc and said dielectric member.

* * * * *